United States Patent [19]
Ker

[11] Patent Number: 5,901,022
[45] Date of Patent: May 4, 1999

[54] CHARGED DEVICE MODE ESD PROTECTION CIRCUIT

[75] Inventor: Ming-Dou Ker, Hsinchu, Taiwan

[73] Assignee: Industrial Technology Research Inst., Taiwan

[21] Appl. No.: 08/804,579

[22] Filed: Feb. 24, 1997

[51] Int. Cl.[6] .................................................. H02H 9/00
[52] U.S. Cl. ............................................. 361/56; 361/111
[58] Field of Search .............................. 361/18, 56, 111, 361/119; 257/111, 175, 355, 356

[56] References Cited

U.S. PATENT DOCUMENTS 5,446,311   8/1995   Ewen et al. ............................. 257/531

OTHER PUBLICATIONS

Standard for ESD Sensitivity Testing—Human Body Model (HBM) Component Level, EOS/ESD–S5.1, EOS/ESD Association, 1993. No Month.

Draft Standard for ESD Sensitivity Testing—Machine Model (MM) Component Level, EOS/ESD–DS5.2, EOS/ESD Association, 1992. No Month.

Draft Standard for Charged Device Model (CDM) ESD Sensitivity Testing (socketed CDM and non–socketed CDM), EOS/ESD–DS5.3.1, EOS/ESD Association, 1993. No Month.

K. Verhaege et al., "Influence of tester, test method and device type on CDM ESD testing," Proc. of EOS/ESD Symp., 1994, pp. 49–62. No Month.

M. Tanaka et al., "Clarification of ultra–high–speed electrostatic discharge and unification of discharge model," Proc. of EOS/ESD Symp., 1994, pp. 171–181. No Month.

R. Renninger et al., "A field–induced charged–device model simulator," Proc. of EOS/ESD Symp., 1989, pp. 59–71. No Month.

A. Olney, "A combined socketed and non–socketed CDM test approach for eliminating real–world CDM failures," Proc. of EOS/ESD Symp., 1996, vol. 18, pp. 62–75. No Month.

C. Chen, J. Chou, W. Lur, and S. Sun, "A novel 0.25 $\mu$m shallow trench isolation technology," IEEE IEDM, 1996, pp. 837–840. No month.

T. Maloney, "Designing MOS inputs and outputs to avoid oxide failure in the charged device model," Proc. of EOS/ESD Symp., 1988, pp. 220–227. No Month.

Y. Fukuda, K. Kato, and E. Umemura, "ESD and latch up phenomena on advanced technology LSI," Proc. of EOS/ESD Symp., 1996, pp. 76–84. No Month.

G. Meneghesso, J. Luchies, F. Kuper, and A. Mouthaan, "Turn–on speed of grounded gate NMOS ESD protection transistors," Proc. of European Symposium on Reliability of Electron Devices, Failure Physics and Analysis, (Journal of Microelectronics and Reliability, vol. 36, No. 11/12, pp. 1735–1738, 1996. No Month.

C. Russ, K. Verhaege, K. Bock, G. Groeseneken, and H. Mass, "Simulation study for the CDM ESD behavior of the grounded–gate NMOS," Proc. of European Symposium on Reliability of Electron Devices, Failure Physics and Analysis, (Journal of Microelectronics and Reliability, vol. 36, No. 11/12, pp. 1739–1742, 1996. No Month.

(List continued on next page.)

*Primary Examiner*—Ronald W. Leja
*Attorney, Agent, or Firm*—Proskauer Rose LLP

[57] ABSTRACT

An ESD protection circuit for deep-submicron CMOS IC's provides Charged-Device Model (CDM) protection in addition to Human-Body Model (HBM) and Machine Model (MM) ESD events. An on-chip inductor is connected in series between a conventional ESD protection circuit and the thin gate oxide of a charged-device IC input stage. The inductor provides a voltage drop effect, a current limitation effect, and a time delay effect to prevent the CDM ESD current from being discharged through the thin gate oxide of the input stage IC. The inductor cooperates with traditional input ESD protection circuits to enable full ESD protection against all HBM, MM, and CDM ESD events. The inductor can be implemented in a square spiral layout structure of metal and/or poly, and can be placed directly under the input bonding pad, so as not to increase the total layout area of the input pad and input ESD protection circuits.

11 Claims, 11 Drawing Sheets

OTHER PUBLICATIONS

C. Russ, K. Verhaege, K. Bock, P. Roussel, G. Groeseneken, and H. Maes," A compact model for the grounded–gate NMOS behavior under CDM ESD stress," Proc. of EOS/ESD Symp., 1996, pp. 302–315. No Month.

N. Nguyen and R. Meyer, "Si IC–compatible inductors and LC passive filters," IEEE Journal of Solid–State Circuits, vol. 25, pp. 1028–1031, 1990. No Month.

B.–K. Kim et al., Monolithic planar RF inductor and waveguide structures on silicon with performance comparable to those in GaAs MMIC, IEEE IEDM, 1995, pp. 717–720. No Month.

J. Burghartz, M. Soyuer, and K. Jenkins, "Microwave inductors and capacitors in standard multilevel interconnect silicon technology," IEEE Trans. Microwave Theory and Technology, vol. 44, No. 1, pp. 100–104, 1996. No Month.

M. Soyuer et al., "Multilevel monolithic inductors in silicon technology," Electronics Letters, vol. 31, No. 5, pp. 359–360, 1995. No Month.

J. Burghartz et al., "Monolithic spiral inductors fabricated using a VLSI Cudamascene interconnect technology and low–loss substrates," IEEE EEDM, 1996, pp. 99–102. No Month.

C.–Y. Wu and S.–Y. Hsiao, "Analysis and modeling of square spiral inductors on silicon substrate," Proc. of International Conference on Electronics, Circuits, and Systems, 1995, pp. 528–531. No Month.

CHARGED DEVICE MODE ESD PROTECTION CIRCUIT

FIELD OF THE INVENTION

The present invention relates to an ESD protection circuit for deep-submicron CMOS Integrated Circuits (IC's). More specifically, the present invention relates to an ESD protection circuit for the Charged-Device mode of electrostatic discharge phenomena.

BACKGROUND OF THE INVENTION

ESD (Electrostatic Discharge) protection design is a major factor in the reliability of deep-submicron CMOS Integrated Circuits (IC's). Since CMOS development technology is aggressive in the deep-submicron category, the device size and the thickness of the gate oxide are being continually reduced to improve the operating speed of the CMOS devices and integration density of the IC's. These highly scaled-down devices, however, have been found to be increasingly vulnerable to ESD. Therefore, ESD protection circuits have been added into the CMOS IC's to protect the IC's against ESD damage. Typically, ESD protection circuits are implemented around the input and output pads of the IC's to bypass ESD current away from the internal circuits of the IC's.

As a result of detailed investigations of ESD events on IC products, it is known that there are three main types of ESD events: Human-Body Model (HBM), Machine Model (MM), and Charged-Device Model (CDM). These three ESD models have been well understood, and have been widely used as the industrial ESD testing standards, as noted in the following references:

[1] Standard for ESD Sensitivity Testing—Human Body Model (HBM) Component Level, EOS/ESD-S5.1, EOS/ESD Association, 1993.

[2] Draft Standard for ESD Sensitivity Testing—Machine Model (MM) Component Level, EOS/ESD-DS5.2, EOS/ESD Association, 1992.

[3] Draft Standard for Charged Device Model (CDM) ESD Sensitivity Testing (socketed CDM and non-socketed CDM), EOS/ESD-DS5.3.1, EOS/ESD Association, 1993.

[4] Draft Standard for Charged Device Model (CDM) ESD Sensitivity Testing (non-socketed CDM), EOS/ESD-DS5.3.2, EOS/ESD Association, 1996.

[5] JEDEC Field-Induced Charged Device Model (CDM) Test Method for Electrostatic Discharge (ESD) Withstand Thresholds of Microelectronics Components, JESD22-C101, May 1995.

Figure 1A:
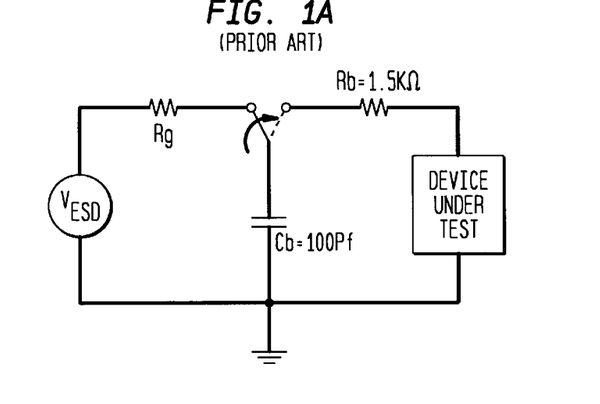
FIG. 1 depicts equivalent circuits of the (a) HBM, (b) MM, and (c) CDM ESD models.
Figure 1B:
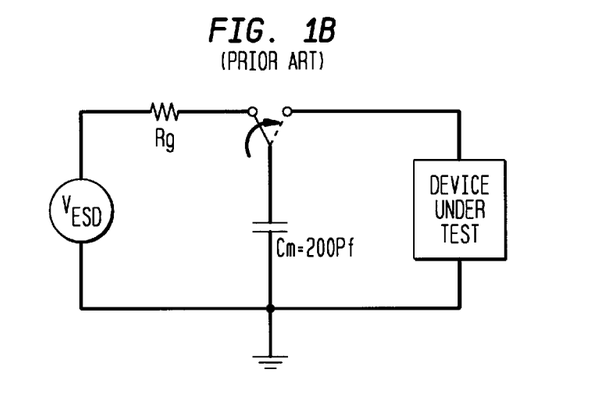

The equivalent circuits of these three ESD models are illustrated in FIG. 1. In the HBM and MM models, FIGS. 1(a) and (b), the discharge current of the ESD event is from the outside of the IC into the inside of the IC, through the input or output pins. Therefore, the ESD protection circuit is designed to limit the ESD current into the internal parts of the IC from the input or output pins.

Figure 2:
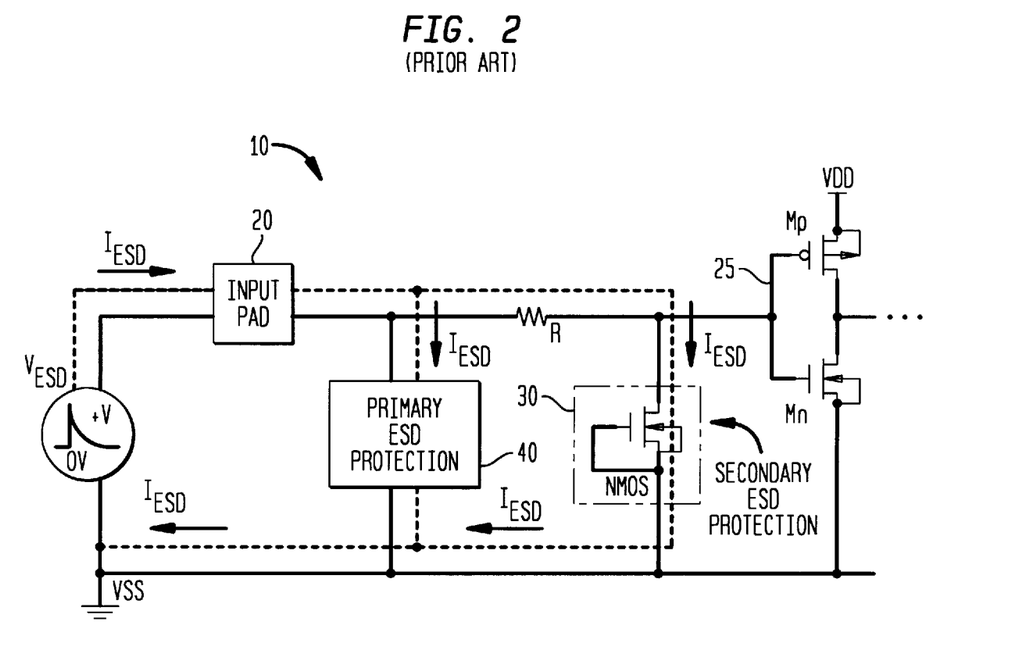
FIG. 2 shows a typical design of an ESD protection circuit to protect against HBM and MM ESD events.

A typical design for an ESD protection circuit 10 for HBM and MM ESD events is shown in FIG. 2, where there are primary and secondary ESD protection elements 40, 30. When an HBM or MM ESD voltage $V_{ESD}$ appears at the input pad 20, it acts as an input signal to the gate oxide 25 of the input stage. Since this ESD voltage $V_{ESD}$ may be sufficient to damage the gate oxide 25 of the input stage, it must be clamped by the ESD protection elements 40, 30. In FIG. 2, a short-channel thin-oxide NMOS is used as the secondary protection element 30 to first limit the ESD voltage $V_{ESD}$ across the gate oxide of the input stage. The short-channel thin-oxide NMOS 30 is designed to operate in its snapback—breakdown region, in order to clamp the voltage level across the gate oxide 25 of the input stage at as low a level as possible, when $V_{ESD}$ is positive.

A shorter channel length of the NMOS provides a lower snapback-breakdown voltage for clamping an ESD voltage, but is only effective at low ESD levels. Therefore, a primary ESD protection element 40, with greater ESD robustness is typically also connected to the input pad 20 to provide the main bypass for the ESD current. The devices commonly used as primary ESD protection elements are long-channel NMOS, field-oxide device (lateral bipolar transistor), or lateral SCR devices. The primary ESD protection devices with high ESD protection levels generally have a relatively high trigger (or breakdown) voltage, so that the secondary ESD protection device is activated first to clamp the ESD voltage across the gate oxide. Then, due to the increase of voltage drop across the series resistor R and the broken-down secondary ESD protection device 30, the primary ESD protection element 40 is triggered to bypass the main ESD current. Suitable designs of the ESD protection circuit of FIG. 2 can provide the input pads of IC's with high ESD robustness against HBM and MM ESD events.

Figure 1C:
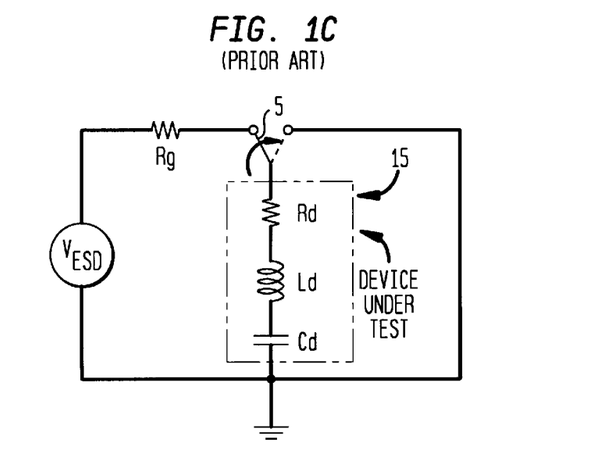

In the CDM ESD model, as shown in FIG. 1(c), the ESD voltage $V_{ESD}$ does not come from outside the IC 15, but rather from the device itself. The substrate of the IC 15 is assumed to be charged in a CDM ESD event, and then a pin 5 of the IC 15 is shorted to ground. The charging process does not subject the IC to any ESD damage. The static charge is stored in the equivalent capacitance (Cd) of the IC 15, which is dependent on the chip size and the type of IC package. The equivalent resistance (Rd) and inductance (Ld) of the IC 15 are also dependent on the IC itself and its package. When pin 5 of the charged IC touches ground, the discharge (ESD) current goes from the charged IC 15 to ground through pin 5. This CDM ESD current is discharged from the inside of the IC 15 to the outside of the IC 15. The discharging mechanism of the CDM ESD event is, therefore, quite different from that of the HBM or MM ESD events, and results in different kinds of ESD damage to the IC.

To simulate a CDM ESD event for industrial testing, two types of CDM ESD testers have been developed. One is a socketed tester, and the other is a non-socketed tester, as described in the preceding references [3]–[5], and in the following references:

[6] K. Verhaege et al., "Influence of tester, test method and device type on CDM ESD testing," Proc. of EOS/ESD Symp., 1994, pp. 49–62.

[7] M. Tanaka et al., "Clarification of ultra-high-speed electrostatic discharge and unification of discharge model," Proc. of EOS/ESD Symp., 1994, pp. 171–181.

[8] R. Renninger et al., "A field-induced charged-device model simulator," Proc. of EOS/ESD Symp., 1989, pp. 59–71.

[9] A. Olney, "A combined socketed and non-socketed CDM test approach for eliminating real-world CDM failures," Proc. of EOS/ESD Symp., 1996, Vol. 18, pp. 62–75.

The socketed CDM ESD is discharged by a high-speed relay (switch) to ground (see reference [7]). The non-socketed CDM ESD is discharged by a grounded discharge probe (see reference [8]).

Figure 3:
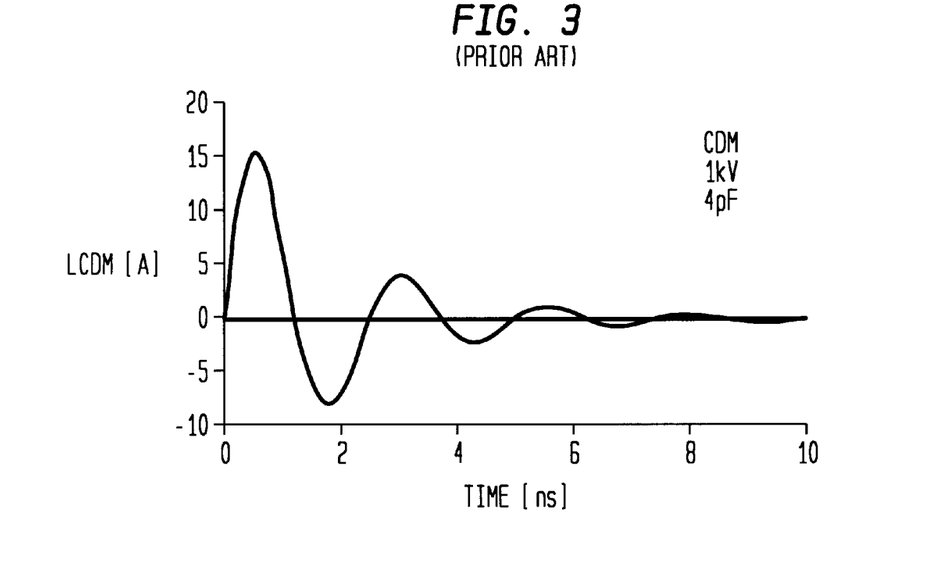
FIG. 3 illustrates the discharge current waveform of a 1000-V CDM ESD event measured in a non-socketed CDM ESD tester with a 4 pF load verification module.
Figure 4:
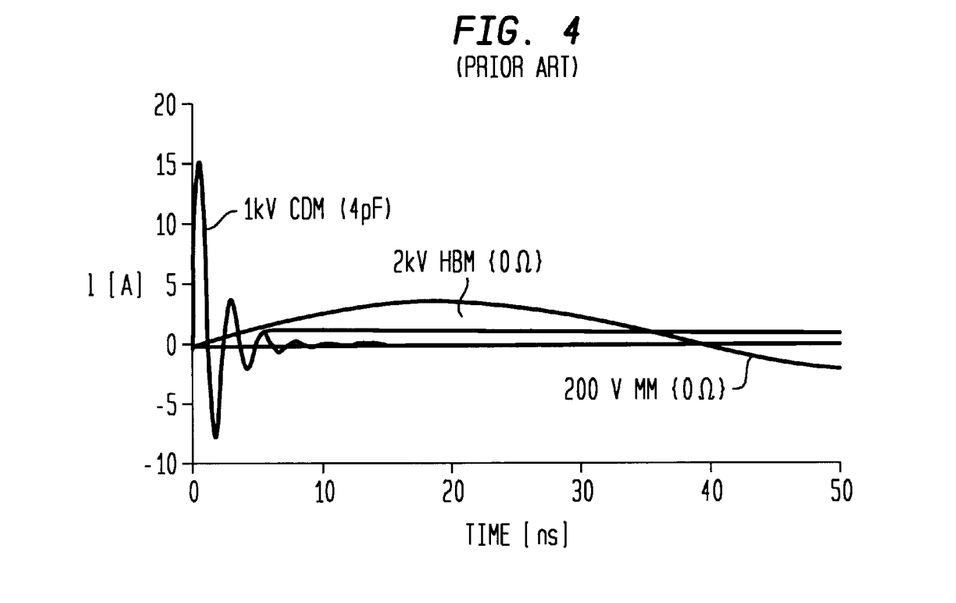
FIG. 4 compares the discharge current waveforms in the time domain between the HBM (2000 V), MM (200 V), and CDM (1000 V) ESD events.

As a result of these investigations, it has been found that the CDM ESD discharge current pulse has a very fast rise time. For example, a 1000-V CDM ESD event can generate a peak discharge current of approximately 15 A, with a rise time around 0.1–0.2 ns. A typical discharge current waveform of a 1000-V CDM ESD event from a CDM ESD tester with a 4 pF verification module is shown in FIG. 3. A comparison of the discharge current waveforms between HBM (2000 V), MM (200 V), and CDM (1000 V) ESD events is shown in FIG. 4, where the CDM is clearly the fastest pulse, with a rise time of only 0.1 ns, as described in the following reference:

[10] H. Gieser et al., "Survey on electrostatic susceptibility of integrated circuits," Proc. of European Symposium on Reliability of Electron Devices, Failure Physics and Analysis, 1994, pp. 447–456.

With such a fast CDM ESD transition, the above described known ESD protection devices can not be triggered fast enough to protect the thin gate oxide of an input stage in deep-submicron CMOS IC's. In order to provide a sufficiently fast response to a CDM ESD transition, the turn-on speed of the ESD protection device should be in the order of 10 GHz. But, in most deep-submicron CMOS technologies, it is very difficult to design and fabricate a sufficiently fast ESD protection device for commercial IC products. Moreover, in deep-submicron CMOS IC's, the gate oxide has been increasingly scaled down for high-speed and low-voltage applications. Typically, in 0.25-$\mu$m CMOS technology, the gate oxide is scaled down to about 50–70 Å. This type of very thin gate oxide can be ruptured by a voltage of only 6–7 V, as described in the following reference:

[11] C. Chen, J. Chou, W. Lur, and S. Sun, "A novel 0.25 $\mu$m shallow trench isolation technology," IEEE IEDM, 1996, pp. 837–840.

The very thin gate oxides of deep-submicron CMOS IC's are very sensitive to ESD stress, and traditional ESD protection devices can not turn on in time to bypass the fast discharge current generated by CDM ESD events. Therefore, CDM ESD protection design has become an urgent and challenging design problem for improving the reliability of deep-submicron CMOS IC's.

Figure 5:
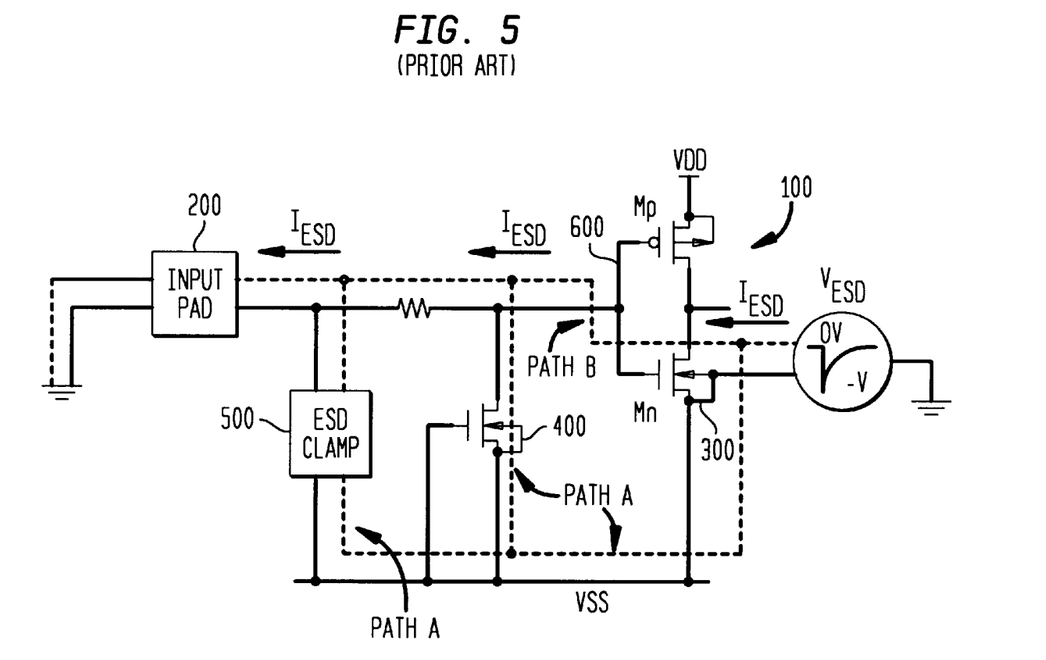
FIG. 5 is a schematic circuit diagram showing the CDM ESD damage potential to the gate oxide of an input stage, when protected by a traditional input ESD protection circuit.

The traditional ESD protection design, as shown in FIG. 2, does not provide effective ESD protection for thin gate oxides in a CDM ESD event. This problem is illustrated in FIG. 5, where current discharge paths $I_{ESD}$ are shown, due to a negative CDM ESD event $V_{ESD}$. As shown in FIG. 5, there are two possible ESD discharge paths, path A and path B. The negative ESD voltage $V_{ESD}$ is initially stored in the P-substrate of the NMOS chip 100, and the discharge current occurs when the input pad 200 is grounded. The ESD current $I_{ESD}$ may go through the source 300 of NMOS 100 to the VSS power line, and then along the VSS line to the ESD protection circuits 400, 500, as "path A". The short-channel NMOS 400 (secondary ESD protection element) or the ESD clamp device 500 (primary ESD protection element) may be triggered on to bypass this CDM ESD current. But, in most layouts of actual IC chips, the length of the VSS power line from the input stage 100 to the ESD protection circuits 400, 500 at the input pad 200 is long enough to cause a time delay in bypassing the fast-transition CDM ESD current, as described in the following references:

[12] T. Maloney, "Designing MOS inputs and outputs to avoid oxide failure in the charged device model," Proc. of EOS/ESD Symp., 1988, pp. 220–227.

[13] Y. Fukuda, K. Kato, and E. Umemura, "ESD and latch up phenomena on advanced technology LSI," Proc. of EOS/ESD Symp., 1996, pp. 76–84.

Moreover, the turn-on speed of the ESD protection devices 400, 500 is slower than the transition of the CDM ESD current. Thus, the fast CDM ESD current is first discharged through the thin gate oxide 600 of the input stage 100, as "path B", shown in FIG. 5. This causes ESD damage to the gate oxide 600 of the input stage 100, rather than being protected by the ESD protection circuits 400, 500 at the input pad 200.

Figure 6:
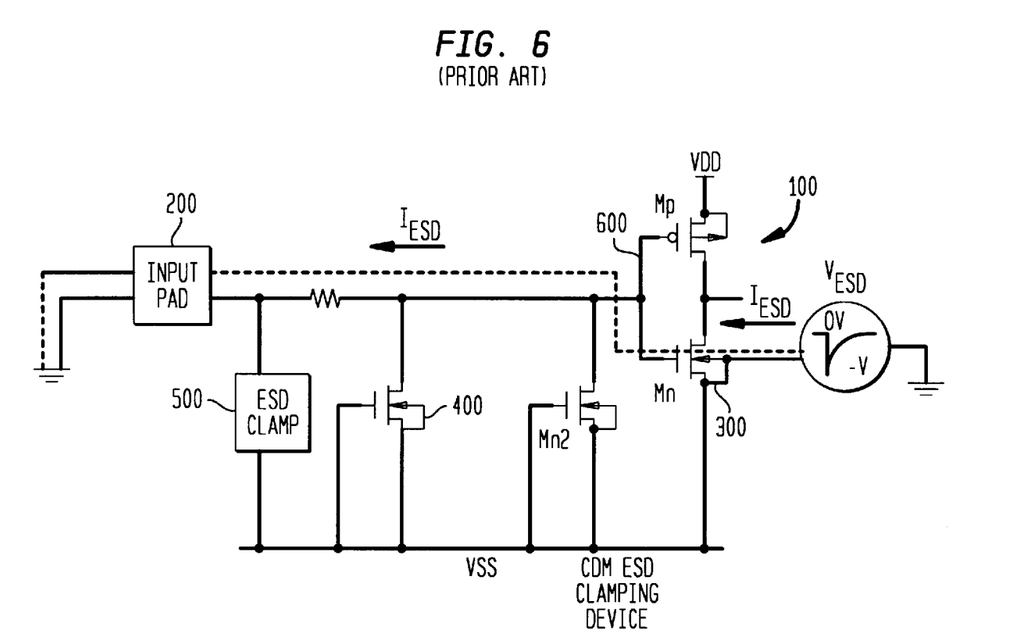
FIG. 6 shows a prior art CDM ESD protection circuit using an extra short-channel NMOS (Mn2) close to the gate oxide of an input stage.

To overcome this ESD damage problem for CDM ESD events, one prior art technique adds an extra short-channel NMOS device, Mn2, close to the gate oxide 600 of the input stage 100, as shown in FIG. 6. Mn2 is triggered on if there is an overstress voltage across the gate oxide 600. To provide effective protection, Mn2 has to be placed as close to gate oxide 600 as possible, in order to quickly clamp the ESD voltage across the gate oxide 600. However, since gate oxides of input stages in deep-submicron low-voltage CMOS technology have been scaled down greatly, the turn-on speed of grounded-gate NMOS Mn2 is still slower than the rise time (~0.1 ns) of the CDM ESD current, as noted in the following references:

[14] G. Meneghesso, J. Luchies, F. Kuper, and A. Mouthaan, "Turn-on speed of grounded gate NMOS ESD protection transistors," Proc. of European Symposium on Reliability of Electron Devices, Failure Physics and Analysis, (Journal of Microelectronics and Reliability, Vol. 36, No. 11/12, pp. 1735–1738, 1996.

[15] C. Russ, K. Verhaege, K. Bock, G. Groeseneken, and H. Mass, "Simulation study for the CDM ESD behavior of the grounded-gate NMOS," Proc. of European Symposium on Reliability of Electron Devices, Failure Physics and Analysis, (Journal of Microelectronics and Reliability, Vol. 36, No. 11/12, pp. 1739–1742, 1996.

[16] C. Russ, K. Verhaege, K. Bock, P. Roussel, G. Groeseneken, and H. Maes, "A compact model for the grounded-gate NMOS behavior under CDM ESD stress," Proc. of EOS/ESD Symp., 1996, pp. 302–315.

Therefore, the gate oxide 600 is still vulnerable to damage from a CDM ESD event. That is, the initial discharge current, as shown in FIG. 6, still passes through gate oxide 600 when CDM ESD events occur.

Figure 7:
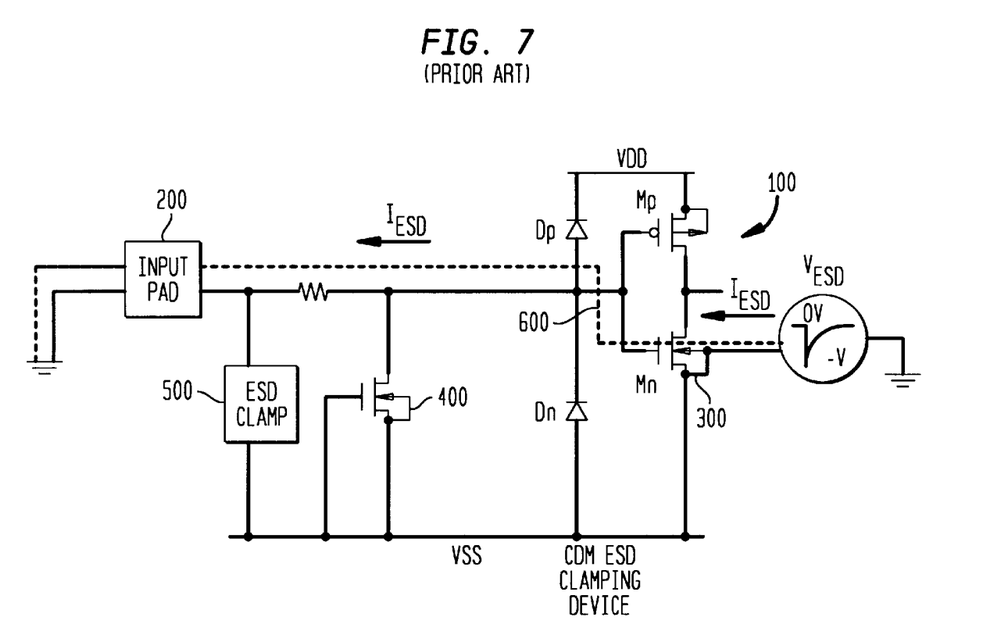
FIG. 7 shows a prior art CDM ESD protection circuit using double diodes close to the gate oxide of an input stage.

Another prior art technique to protect against CDM ESD events is shown in FIG. 7, with two additional diodes Dp and Dn. However, the diode break-down speed is even slower than the turn-on speed of the short-channel NMOS device (Mn2 in FIG. 6). Therefore, diodes Dp and Dn can not provide voltage-clamping fast enough to protect the thin gate oxide 600. The fast-transition CDM ESD current will still discharge through the gate oxide 600 of input stage 100, leaving it vulnerable to damage. Thus, there is not yet an effective prior art solution to fully protect the gate oxide of an input stage in deep-submicron CMOS technology against CDM ESD events.

It is therefore an object of the present invention to overcome the disadvantages of the prior art by providing full HBM, MM, and CDM ESD protection for deep-submicron CMOS IC's.

It is another object of the present invention to provide such ESD protection with no increase in layout area.

SUMMARY OF THE INVENTION

The inventive CDM ESD protection circuit overcomes the problems associated with prior art CDM ESD techniques, while still maintaining full ESD protection for HBM and MM events. Moreover, the inventive ESD protection circuit implementation provides full HBM, MM, and CDM ESD protection with no increase in layout area.

In accordance with a preferred embodiment, the inventive CDM ESD protection circuit comprises an input pad connected to one end of a conventional primary ESD protection circuit. The other end of the primary ESD circuit is connected to a VSS power line. A conventional secondary ESD protection circuit is connected in parallel with the primary circuit. The inventive circuit element, an on-chip inductor, is connected in series from the end of the secondary circuit not connected to VSS to a charged-device component of an internal circuit to be protected, such as the thin gate oxide of a deep-submicron CMOS IC input stage. The input stage is, illustratively, a CMOS buffer connected between a VDD power line and VSS.

When a CDM event occurs, for example, as a result of grounding the input pad, any charge stored in the input stage IC will discharge through the circuit. Since the CDM discharge current has a very high rate of change, the series inductor will present a very high initial impedance to this current flow. As a result, the main current discharge path is routed through the NMOS source to VSS, and then through the primary and secondary ESD protection circuits and input pad to ground. Thus, the thin gate oxide is protected from excessive discharging current by the blocking action of the series inductor.

The inventive on-chip inductor can be implemented in a planar square spiral, using either metals or poly, or a combination of both. Moreover, the inductor can be located directly under the input pad, so that there is no increase in the layout area.

An illustrative embodiment of the present invention is more fully described below in conjunction with the following drawings.

DETAILED DESCRIPTION OF THE INVENTION

Figure 8:
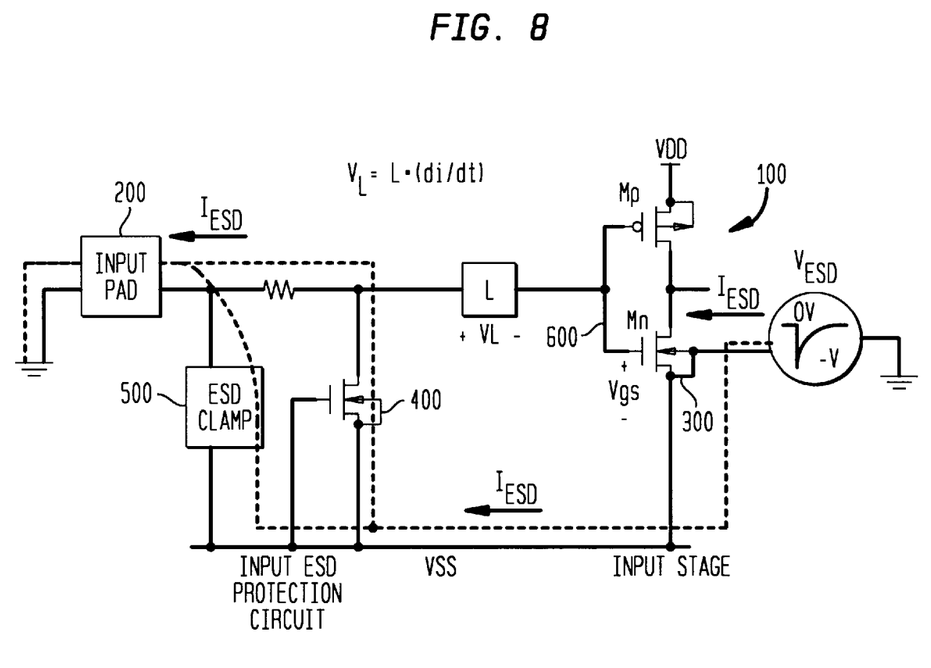
FIG. 8 shows a schematic circuit diagram of the present invention, using an inductor to protect against CDM ESD events.

In the present invention, efficient CDM ESD protection is provided for components of internal circuits of IC chips, such as the thin gate oxide of an input stage in deep-submicron CMOS technology. The inventive CDM ESD protection design is illustrated in FIG. 8. An on-chip inductor "L" is connected between the input ESD protection circuits 400, 500 and the charged-device component of the internal circuit to be protected, illustratively, the gate oxide 600 of input stage 100. The input ESD protection circuits 400, 500 provide effective ESD protection for HBM and MM ESD events, and the inductor "L" cooperates with input ESD protection circuits 400, 500 to provide effective ESD protection against CDM ESD events as well. Therefore, this invention provides ESD protection for HBM, MM, and CDM ESD events.

The circuit characteristic of an inductor is "$V_L=L*(di/dt)$". That is, if the current through an inductor is changed very rapidly, a very high voltage drop will develop across the inductor. As a result, the current of an inductor can not be changed instantaneously. For example, in a CDM ESD event, as depicted in FIG. 8, a 1000-V CDM ESD voltage $V_{ESD}$ can cause a current peak of 15A with a rise time of about 0.1 ns (as shown in FIG. 3). If inductor "L" has an inductance of 5 nH, then a 1000-V CDM ESD discharge current $I_{ESD}$ will cause a voltage drop of 750 V across inductor "L". Therefore, most of the ESD voltage will appear across the inductor, rather than across the gate oxide 600 of input stage 100. Thus, gate oxide 600 will be protected against the CDM ESD event.

From the view point of current discharge, any ESD current passing through gate oxide 600 must also go through the series inductor "L". Due to the aforementioned characteristic of inductor "L", however, the current through inductor "L" can not be changed rapidly. Therefore, the fast changing CDM ESD discharge current can not pass through inductor "L" and is, therefore, blocked from passing through gate oxide 600. Thus, gate oxide 600 is effectively protected against CDM ESD events by the time delay effect of inductor "L". That is, inductor "L" causes the ESD current $I_{ESD}$ to be diverted away from gate oxide 600, and reroutes it through the source 300 of the NMOS input stage 100 to the VSS power line. The CDM ESD current $I_{ESD}$ is then discharged via input ESD protection circuits 400, 500 through input pad 200 to ground. Since inductor "L" provides a time delay for the initial surge of CDM ESD current $I_{ESD}$, the input EDS protection circuits 400, 500 can be activated in time to bypass the CDM ESD current $I_{ESD}$ away from gate oxide 600.

In FIG. 8, a negative CDM ESD event $V_{ESD}$ is shown on the input stage 100. If, instead, the CDM ESD event has a positive ESD voltage stored in the p-substrate, the CDM ESD current through gate oxide 600 would still be limited by inductor "L", and the input ESD protection circuit in a forward-biased condition would provide the discharge path from the VSS power line to the grounded input pad 200. Thus, the inductor "L" provides ESD protection for both positive and negative CDM ESD events.

While shown in an input terminal protection application, the inductor L can also be connected to an output pad to protect against CDM ESD current discharged through an output terminal.

The physical implementation of an inductor in CMOS technology is well known. Planar square spiral inductors have often been used in CMOS RF IC's, as noted in the following references:

[17] N. Nguyen and R. Meyer, "Si IC-compatible inductors and LC passive filters," IEEE Journal of Solid-State Circuits, vol. 25, pp. 1028–1031, 1990.

[18] B. K. Kim et al., Monolithic planar RF inductor and waveguide structures on silicon with performance comparable to those in GaAs MMIC," IEEE IEDM, 1995, pp.717–720.

[19] J. Burghartz, M. Soyuer, and K. Jenkins, "Microwave inductors and capacitors in standard multilevel interconnect silicon technology," IEEE Trans. Microwave Theory and Technology, vol. 44, no. 1, pp. 100–104, 1996.

[20] J. Ewen, S. Ponnapalli, and M. Soyuer, "High-Q inductors in silicon technology without expensive metalization," U.S. Pat. No. 5,446,311, 1995.

[21] M. Soyuer et al., "Multilevel monolithic inductors in silicon technology," Electronics Letters, vol. 31, no. 5, pp. 359–360, 1995.

[22] J. Burghartz et al., "Monolithic spiral inductors fabricated using a VLSI Cudamascene interconnect technology and low-loss substrates," IEEE EEDM, 1996, pp. 99–102.

Because the inductor used in the inventive CDM ESD protection design does not require high precision, an equivalent inductance in the order of several nH is sufficient to provide the desired CDM ESD protection.

Figure 9:
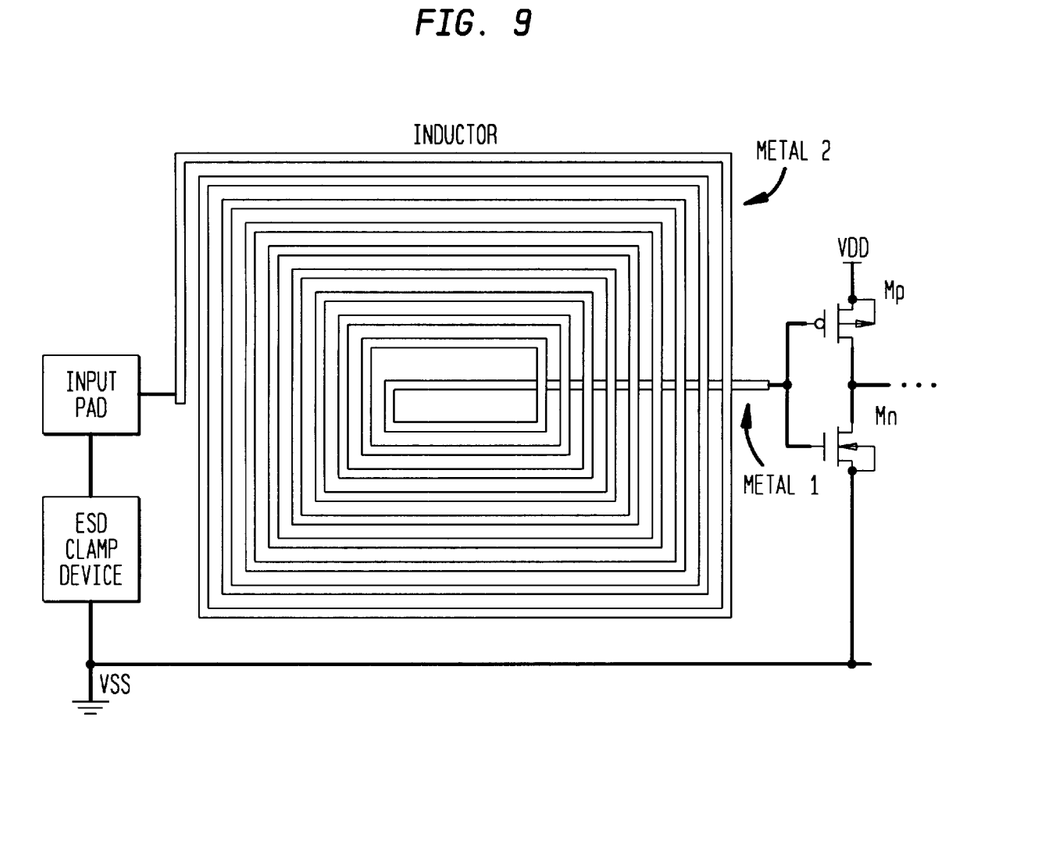
FIG. 9 depicts an implementation of the inductor in CMOS technology, using a square spiral inductor layout with metal 2 and metal 1.

A simple method for implementing an inductor for CDM ESD protection is shown in FIG. 9, where a planar square spiral inductor is made from the combination of the metal 2 and the metal 1.

Figure 10:
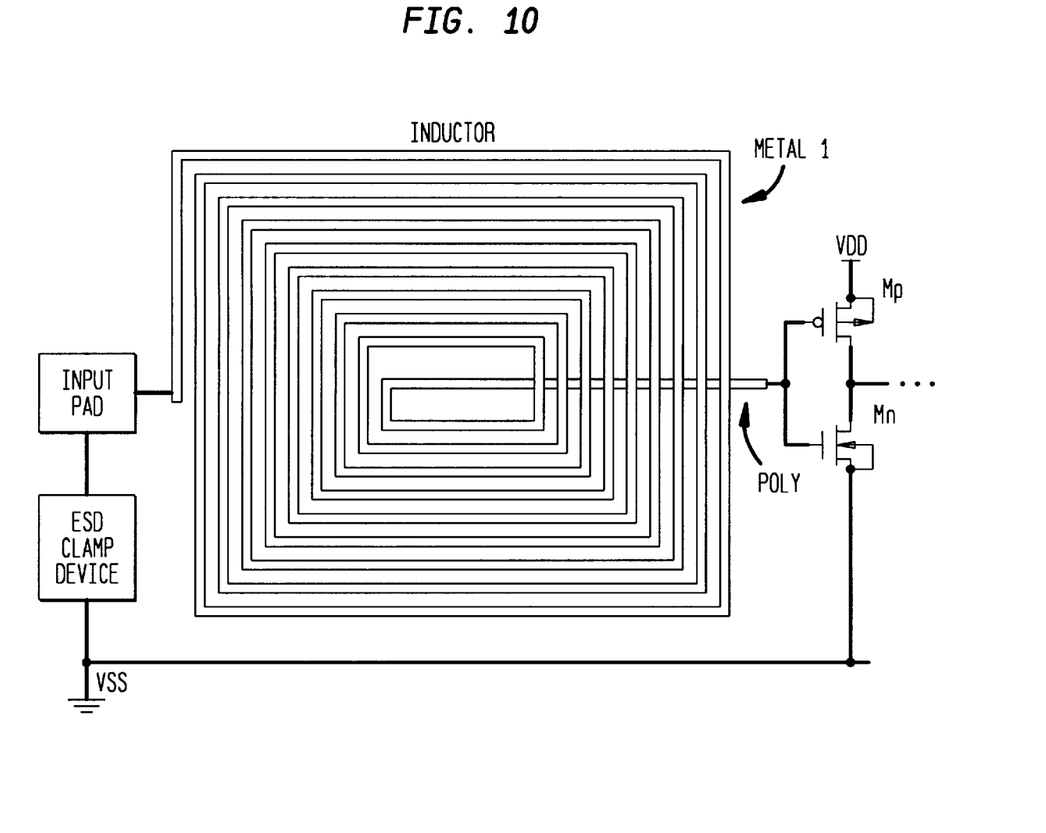
FIG. 10 depicts another implementation of the inductor in CMOS technology, using a square spiral inductor layout with metal 1 and poly line.

In FIG. 10, the inductor is implemented by the metal 1 and the poly line. Using a width of 100-$\mu$m in each outer side of the square spiral inductor, an equivalent inductance of about 8–10 nH can be realized in 0.8 $\mu$m CMOS technology, according to the following reference:

[23] C. Y. Wu and S. Y. Hsiao, "Analysis and modeling of square spiral inductors on silicon substrate," Proc. of International Conference on Electronics, Circuits, and Systems, 1995, pp. 528–531.

Thus, an inductor of several nH can be readily implemented by square spiral inductors, as shown in FIGS. 9 and 10. Other implementation methods for inductors in silicon technology may also be used.

Figure 11:
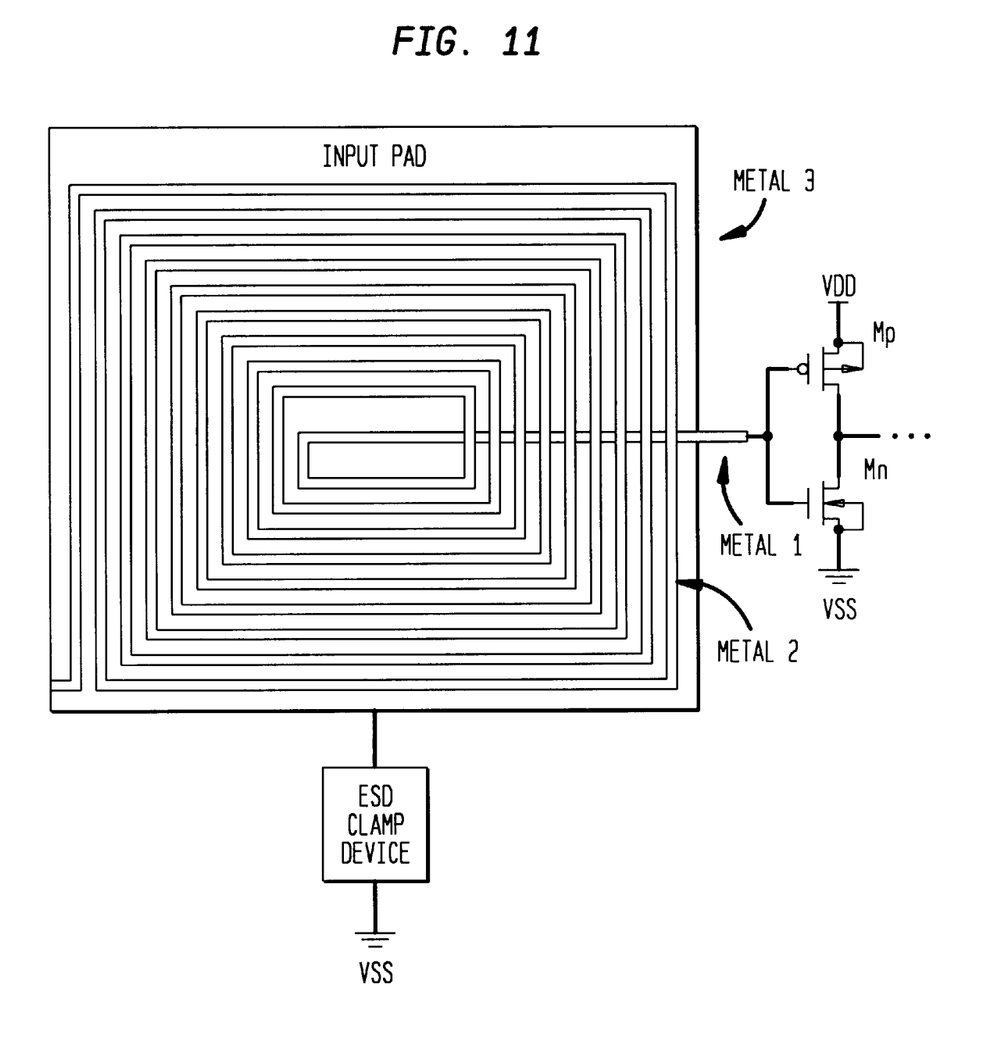
FIG. 11 depicts the location of the inductor under a bonding pad in a triple-metal CMOS technology, with no increase in layout area.
Figure 12:
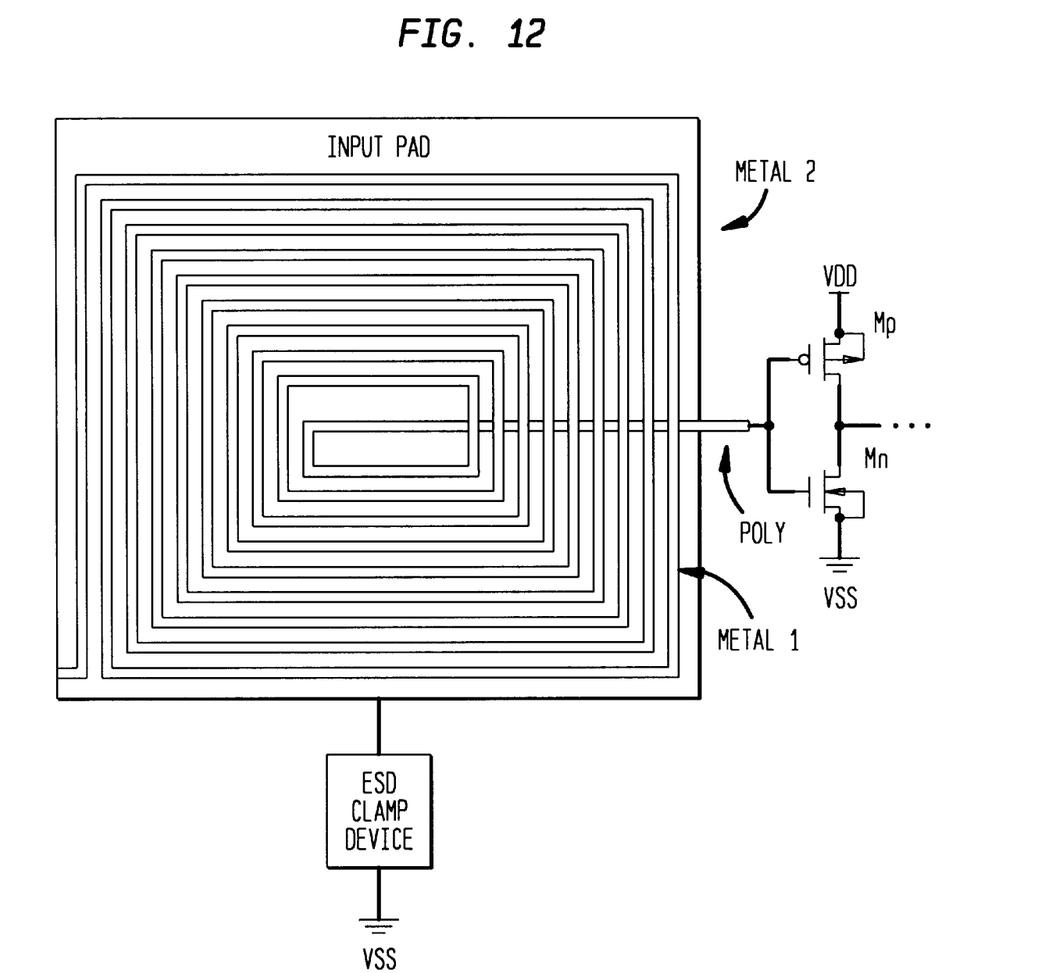
FIG. 12 depicts the location of the inductor under a bonding pad in a double-metal CMOS technology, with no increase in layout area.

To implement the inventive inductor without increasing the total layout area of an input ESD protection circuit and pad, the inventive inductor is placed directly under a bonding metal pad, as shown in FIGS. 11 and 12. In FIG. 11, the CMOS technology provides a triple-metal interconnection, so that the pad (bonding pad) can be realized by the Metal 3, while the inductor is realized by the Metal 2 and the Metal 1, and is placed under the pad of Metal 3. Thus, the additional inventive inductor for CDM ESD protection does not increase the total layout area of the input ESD protection circuit.

If the CMOS technology uses a double-metal interconnection, the inventive inductor can still be implemented directly under the pad, as shown in FIG. 12. The bonding pad in FIG. 12 is realized by the Metal 2, and the inductor is realized by the Metal I and the Poly line. Again, the inductor is inserted directly under the bonding pad without increasing the layout area of the input ESD protection circuit.

In short, IC's susceptible to HBM, MM, and CDM ESD events can all be filly protected by means of the present invention, without increasing the total layout area of the input ESD protection circuit or IC. Thus, the present invention provides efficient and effective ESD protection for deep-submicron CMOS technology within a small layout area in high-density applications.

I claim:

1. An IC chip having a Charged-Device Model (CDM) ESD protection circuit for deep-submicron CMOS Integrated Circuits, comprising:

an input pad, having an input and an output, a primary ESD protection circuit having a first end connected to said output of said input pad, and a second end connected to a VSS power line, a secondary ESD protection circuit having a first end connected in parallel with said first end of said primary ESD protection circuit, and having a second end connected to said VSS power line, an internal circuit having at least one internal component to be protected from ESD damage, connected between a VDD power line and said VSS power line, an on-chip inductor, connected in series between said first end of said secondary ESD protection circuit and said internal component to be protected from ESD damage, wherein when said internal circuit contains an internal CDM ESD charge, and when said input of said input pad is grounded, the rapidly increasing CDM ESD discharge current generated from said internal CDM ESD charge will be blocked from passing through said internal component to be protected by the high initial impedance of said series-connected inductor, and will instead pass through said VSS power line and at least one of said secondary and said primary ESD protection circuits through said input pad to ground.

2. The circuit of claim 1 wherein said internal CDM ESD charge may be negative or positive.

3. The circuit of claim 2 wherein said inductor is realized in a planar square spiral comprised of metal.

4. The circuit of claim 2 wherein said inductor is realized in a planar square spiral comprised of poly.

5. The circuit of claim 2 wherein said inductor is realized in a planar square spiral comprised of a combination of metal and poly.

6. The circuit of claim 2 wherein said inductor is located directly under said input pad, to maintain the same layout area.

7. The circuit of claim 2 wherein said inductor, in cooperation with said primary ESD protection circuit and said secondary ESD protection circuit, provides ESD protection for Human-Body Model, Machine Model, and Charged-Device Model events.

8. An ESD protection circuit for an IC having an internal circuit element to be protected from ESD damage, comprising:

a pad, at least one ESD protection circuit having a first end connected to said pad, and a second end connected to a VSS power line, an on-chip inductor, connected in series between said at least one ESD protection circuit and said IC internal circuit element to be protected, wherein when said IC contains an internal Charged-Device Model (CDM) ESD charge, and when said pad is grounded, the resultant rapidly increasing CDM ESD discharge current is blocked from passing through said internal circuit element to be protected by the initial high impedance of said series-connected on-chip inductor, and instead passes through said VSS power line and said at least one ESD protection circuit through said pad to ground.

9. The circuit of claim 8 wherein said at least one ESD protection circuit is a primary circuit, with high triggering voltage and high bypass current characteristics.

10. The circuit of claim 8 wherein said at least one ESD protection circuit is a secondary circuit, with low-triggering voltage and low bypass current.

11. The circuit of claim 1 wherein said inductor has an inductance value such that said CDM ESD discharge current generates a high voltage across said inductor.

* * * * *